United States Patent
Dean

(10) Patent No.: US 7,356,111 B1
(45) Date of Patent: Apr. 8, 2008

(54) APPARATUS AND METHOD FOR FRACTIONAL FREQUENCY DIVISION USING MULTI-PHASE OUTPUT VCO

(75) Inventor: Gregory L. Dean, Standish, ME (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 787 days.

(21) Appl. No.: 10/341,957

(22) Filed: Jan. 14, 2003

(51) Int. Cl.
  *H03D 3/24* (2006.01)
  *H03L 7/06* (2006.01)
  *H03L 7/00* (2006.01)

(52) U.S. Cl. ............... 375/376; 375/373; 327/156; 331/2

(58) Field of Classification Search ............ 331/2, 331/10, 11, 18, 107, 155, 158, 74, 14–17; 327/156, 157, 115, 117, 158, 159; 375/295, 375/296, 120, 376, 156, 373, 260; 455/260, 455/76; 377/47, 48
See application file for complete search history.

(56) References Cited

U.S. PATENT DOCUMENTS

| | | | | |
|---|---|---|---|---|
| 5,059,924 A * | 10/1991 | JenningsCheck | ............ | 331/1 A |
| 5,144,254 A * | 9/1992 | Wilke | ............ | 327/107 |
| 5,420,545 A * | 5/1995 | Davis et al. | ............ | 331/17 |
| 5,550,515 A * | 8/1996 | Liang et al. | ............ | 331/11 |
| 5,694,089 A * | 12/1997 | Adachi et al. | ............ | 331/16 |
| 5,907,253 A * | 5/1999 | Davis et al. | ............ | 327/156 |
| 5,970,110 A * | 10/1999 | Li | ............ | 377/48 |
| 6,005,443 A * | 12/1999 | Damgaard et al. | ............ | 331/14 |
| 6,081,164 A * | 6/2000 | Shigemori et al. | ............ | 331/16 |
| 6,104,222 A * | 8/2000 | Embree | ............ | 327/156 |
| 6,114,915 A * | 9/2000 | Huang et al. | ............ | 331/25 |
| 6,137,336 A * | 10/2000 | Baba et al. | ............ | 327/295 |
| 6,157,694 A * | 12/2000 | Larsson | ............ | 377/48 |
| 6,236,275 B1 * | 5/2001 | Dent | ............ | 331/1 A |
| 6,236,278 B1 * | 5/2001 | Olgaard | ............ | 331/25 |
| 6,298,106 B1 * | 10/2001 | Hernandez Gamazo et al. | . | 375/376 |
| 6,337,601 B1 * | 1/2002 | Klemmer | ............ | 331/34 |
| 6,483,886 B1 * | 11/2002 | Sung et al. | ............ | 375/376 |
| 6,509,800 B2 * | 1/2003 | Stockton | ............ | 331/11 |
| 6,594,330 B1 * | 7/2003 | Wilson | ............ | 375/376 |
| 6,603,360 B2 * | 8/2003 | Kim et al. | ............ | 331/1 A |
| 6,661,291 B2 * | 12/2003 | Jovenin | ............ | 331/1 A |
| 6,693,494 B2 * | 2/2004 | Fan | ............ | 331/17 |
| 6,833,764 B1 * | 12/2004 | Dean | ............ | 331/2 |
| 6,965,272 B2 * | 11/2005 | Trefethen et al. | ............ | 331/44 |
| 6,990,165 B2 * | 1/2006 | Boerstler et al. | ............ | 375/376 |
| 7,190,755 B1 * | 3/2007 | Sung et al. | ............ | 375/376 |
| 2003/0198311 A1 * | 10/2003 | Song et al. | ............ | 375/376 |
| 2005/0030073 A1 * | 2/2005 | Wakayama et al. | ............ | 327/156 |

* cited by examiner

*Primary Examiner*—Mohammed Ghayour
*Assistant Examiner*—Sophia Vlahos

(57) ABSTRACT

A phase-locked loop (PLL) frequency synthesizer capable of being tuned in small step sizes. The PLL frequency synthesizer includes a PLL circuit. A phase-locked loop (PLL) frequency synthesizer includes a PLL core and a feedback frequency divider. The PLL core receives an F(in) signal and generates a plurality of multiphase output signals having an F2 frequency, where $F2=(in)(P+\Delta p)$. The feedback frequency divider receives the plurality of multiphase output signals and generates a feedback signal having a frequency of $F2/(P+\Delta p)$, where P is an integer and $\Delta p$ is a fractional value less than one.

9 Claims, 4 Drawing Sheets

APPARATUS AND METHOD FOR FRACTIONAL FREQUENCY DIVISION USING MULTI-PHASE OUTPUT VCO

CROSS-REFERENCE TO RELATED APPLICATIONS

The present invention is related to that disclosed in U.S. patent application Ser. No. 10/320,851, filed on Dec. 16, 2002, entitled "APPARATUS AND METHOD FOR SYNTHESIZING A FREQUENCY USING VERNIER DIVIDES," and granted as U.S. Pat. No. 6,833,764. U.S. patent application Ser. No. 10/320,851 is commonly assigned to the assignee of the present invention. The disclosure of the related patent application is hereby incorporated by reference for all purposes as if fully set forth herein.

TECHNICAL FIELD OF THE INVENTION

The present invention is generally directed to frequency synthesizers and, more particularly, to a PLL frequency synthesizer that may be finely tuned over a narrow range of frequencies.

BACKGROUND OF THE INVENTION

There have been great advancements in the speed, power, and complexity of integrated circuits, such as application specific integrated circuit (ASIC) chips, radio frequency integrated circuits (RFIC), central processing unit (CPU) chips, digital signal processor (DSP) chips and the like. These advancements have made possible the development of system-on-a-chip (SOC) devices, among other things. A SOC device integrates in one chip all (or nearly all) of the components of a complex electronic system, such as a wireless receiver (i.e., cell phone, a television receiver, microprocessor, high-speed data transceiver, and the like).

In many integrated circuits, a phase-locked loop (PLL) frequency synthesizer generates many of the clock signals that drive the integrated circuit. Phase-locked loops (and delay-locked loops (DLLs)) are well known to those skilled in the art and have been extensively written about. The dynamic performance of the frequency synthesizer that generates clock signals depends on several parameters, including the natural frequency ($F_n$), the damping factor ($D_F$), the crossover frequency ($F_O$) and the ratio of the comparison frequency ($F_c$) to the crossover frequency. The performance of the frequency synthesizer also depends on the performance of the charge pump located in the PLL. The charge pump pulse timing jitter and pulse amplitude noise both contribute to synthesizer phase noise.

A common problem for a conventional PLL based on voltage-controlled oscillator (VCO) is the granularity with which the output frequency may be adjusted. Conventional PLLs contain a frequency divider (i.e., divide-by-N) block in the feedback loop. If the input frequency is F(in), then the output frequency is F(out)=N[F(in)]. However, N is typically an integer, so that increasing or decreasing N results in large increments or large decrements in the output frequency. A fractional N PLL may be implemented that changes in smaller increments. However, a fractional PLL requires complex circuitry and has a much slower response time.

Therefore, there is a need in the art for improved frequency synthesizers for use in generating reference frequency signals. In particular, there is a need in the art for a phase-locked loop (PLL) frequency synthesizer that can be finely tuned over a range of frequencies. More particularly, there is a need for a PLL frequency synthesizer that can be finely tuned and that has a fast response time.

SUMMARY OF THE INVENTION

To address the above-discussed deficiencies of the prior art, it is a primary object of the present invention to provide an improved phase-locked loop (PLL) frequency synthesizer capable of being tuned in small step sizes. According to an advantageous embodiment of the present invention, the PLL frequency synthesizer comprises: 1) a PLL circuit comprising: i) a PLL core capable of receiving an F(in) signal and generating a plurality of multiphase output signals having an F2 frequency, where F2=F(in) (P+Δp), and ii) a feedback frequency divider capable of receiving the plurality of multiphase output signals and generating a feedback signal having a frequency F2/(P+pΔp), wherein P is an integer and Δp is a fractional value less than 1.

According to one embodiment of the present invention, P and Δp are modifiable values.

According to another embodiment of the present invention, the PLL core comprises a phase detector, a charge pump, a loop filter, and a voltage-controlled oscillator (VCO).

According to still another embodiment of the present invention, the phase detector receives and compares the F(in) signal and the feedback signal.

According to yet another embodiment of the present invention, the VCO generates the plurality of multiphase output signals.

According to a further embodiment of the present invention, the feedback frequency divider comprises a counter circuit and a switching circuit capable of receiving the plurality of multiphase output signals and selectively applying selected ones of the plurality of multiphase output signals to an input of the counter circuit.

According to a still further embodiment of the present invention, the switching circuit comprises a multiplexer and a multiplexer control circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase-locked loop (PLL) based frequency generator.

Figure 1:
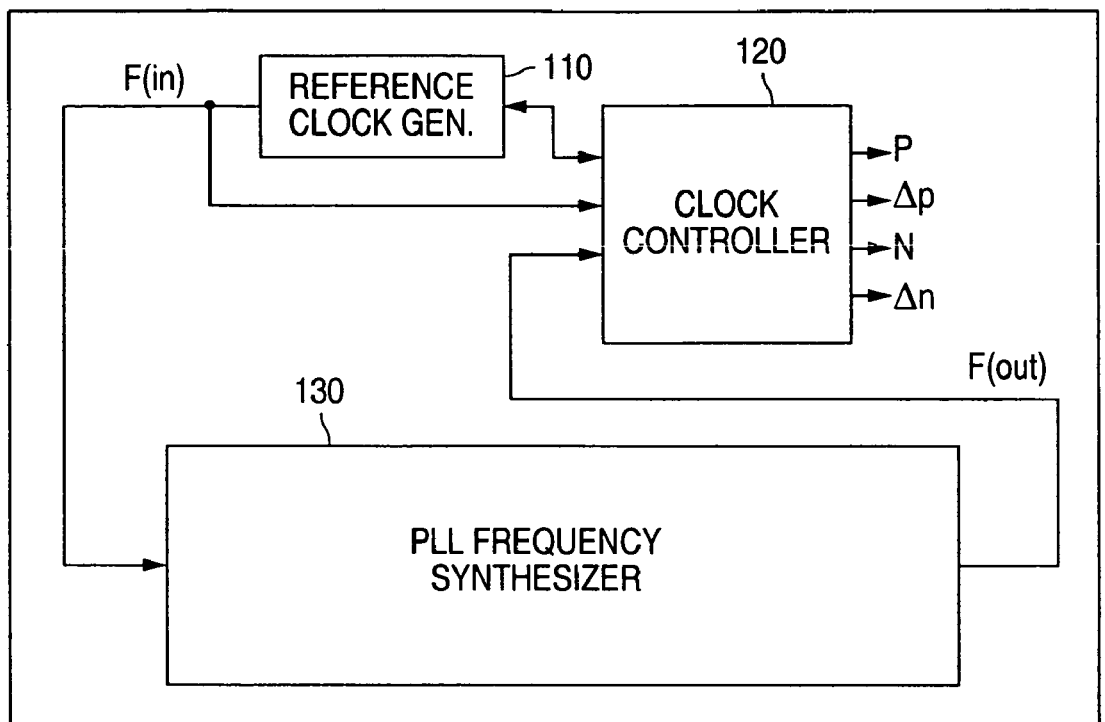
FIG. 1 illustrates a processing system comprising a phase-locked loop (PLL) frequency synthesizer according to an exemplary embodiment of the present invention.

FIG. 1 illustrates processing system 100, which comprises phase-locked loop (PLL) frequency synthesizer 130 according to an exemplary embodiment of the present invention. Processing system 100 comprises reference clock generator 110, clock controller 120 and PLL frequency synthesizer 130. Under the control of clock controller 120, reference clock generator 110 generates a reference signal having a reference frequency, F(in). The F(in) signal is the input to PLL frequency synthesizer 130. PLL frequency synthesizer 130 generates an output signal having a frequency, F(out). As will be explained below in greater detail, the F(out) frequency is a finely tunable multiple of the F(in) frequency, as determined by the values N, Δn, P and Δp, produced by clock controller 120. According to the principles of the present invention, N and P are integer values and Δn and Δp are fractional value.

Processing system 100 is intended to represent any type of electronic device in which a finely tunable reference frequency is required. Thus, for example, processing system 100 may be a wireless communication device (e.g., cell phone), a video processing system (e.g., MPEG decoder), a wireline communication device (e.g., Ethernet card, set-top box, xDSL modem), a digital audio system or digital video system, or the like.

Figure 2:
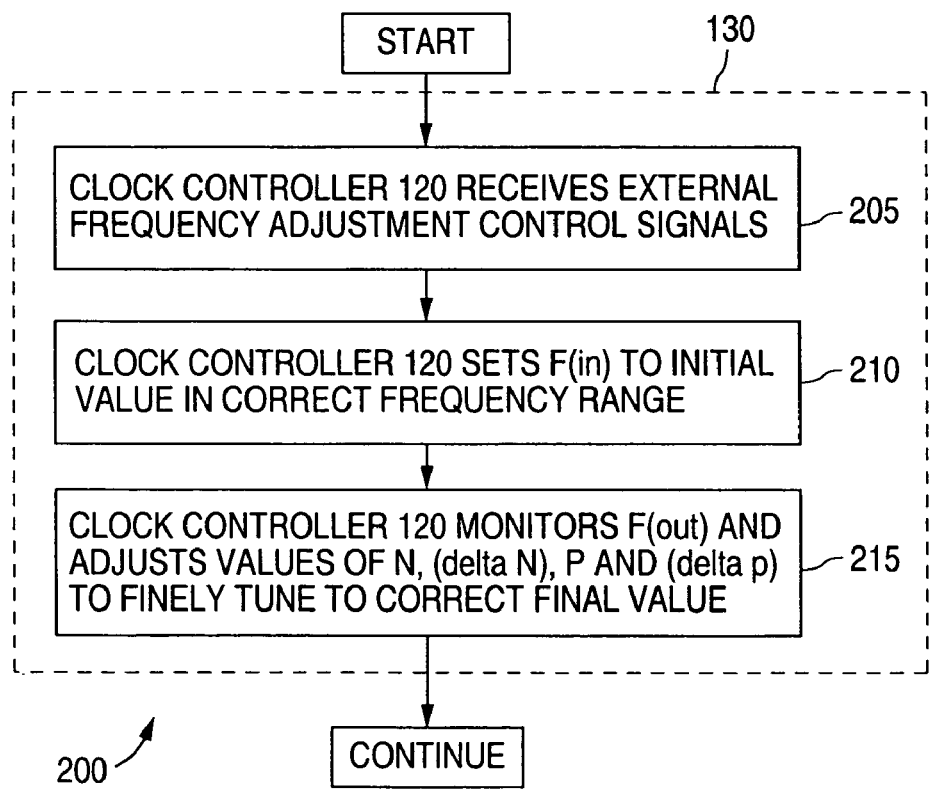
FIG. 2 is a flow diagram illustrating the operation of the exemplary PLL frequency synthesizer according to one embodiment of the present invention.

FIG. 2 depicts flow diagram 200, which illustrates the operation of PLL frequency synthesizer 130 according to an exemplary embodiment of the present invention. During routine operation, clock controller 120 may from time to time receive external frequency adjustment control signals (process step 205). These control signals may be received from an external device, may be generated by other portions of processing system 100, or may be generated in response to inputs from an operator of processing system 100. Clock controller 120 then sets the F(in) reference frequency to an initial value in the correct frequency range (process step 210). Thereafter, clock controller 120 monitors the frequency of the F(out) signal and periodically adjusts the values of N, Δn, P and Δp to finely tune to the correct final value of the F(out) frequency (process step 215).

The present invention provides a fractional-N phase-locked loop (PLL) circuit that is implemented using a voltage-controlled oscillator (VCO) that outputs multiple phases and feedback and output dividers that use the multiple VCO phases to implement fractional frequency division.

Figure 3:
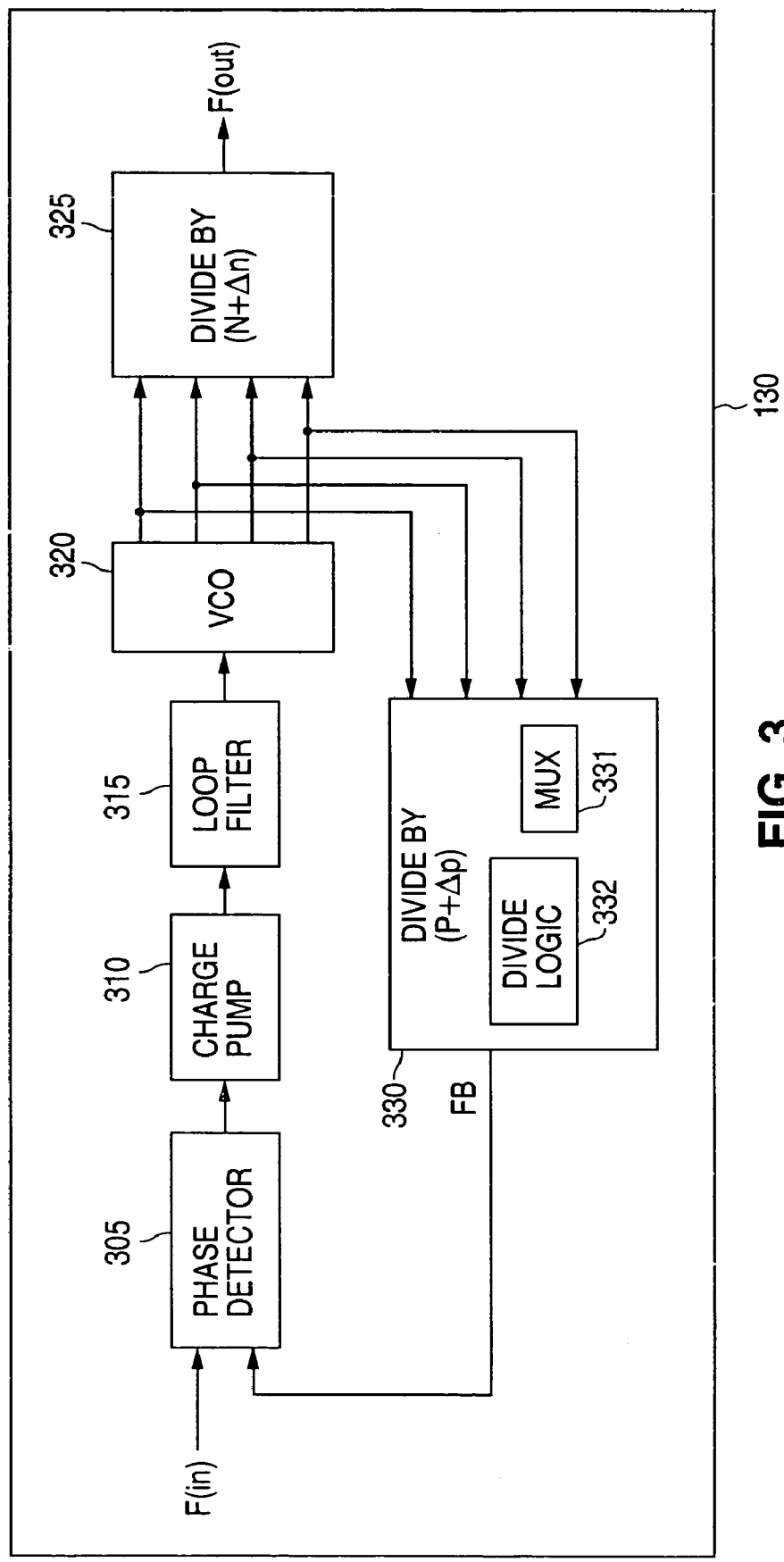
FIG. 3 illustrates a phase-locked loop (PLL) frequency synthesizer that implements a fractional frequency divider according to one embodiment of the present invention.

FIG. 3 illustrates phase-locked loop (PLL) frequency synthesizer 130, which implements a fractional frequency divider according to one embodiment of the present invention. PLL frequency synthesizer 130 comprises phase detector 306, charge pump 310, loop filter 315, voltage controlled oscillator (VCO) 320, output divider 325, and feedback divider 330. PLL frequency synthesizer 130 receives the input reference signal, F(in) and generates the output reference signal, F(out). According to the principles of the present invention, output divider 325 is a "divide by (N+Δn)" circuit, where N is an integer value and Δn is a fractional value, and feedback divider 330 is a "divide by (P+Δp)" circuit, where P is an integer value and Δp is a fractional value.

Phase detector 305 compares the difference in phase/frequency between the output of feedback divider 330 and the input reference signal, F(in). In response to the comparison, phase detection 305 generates a Charge Up signal or a Charge Down signal, depending on whether the output of feedback divider 330 is leading or lagging the F(in) signal. Charge pump 310 receives the Charge Up signal and the Charge Down signal and accordingly either adds charge to, or drains charge from, a large charge capacitor in loop filter 315. Adding charge to, or draining charge from, the capacitor increases or decreases the voltage on the charge capacitor. The voltage on the charge capacitor in loop filter 315 is the control voltage of VCO 320. As the VCO control voltage increases or decreases, the frequency of the output of VCO 320 increases or decreases accordingly.

According to the principles of the present invention, the output of VCO 320 produces a multiphase output that is applied to the input of output divider 325 and feedback divider 330. Each one of output divider 325 and feedback divider 330 is capable of rapidly selecting different ones of the multiphase outputs in order to divide the frequency of the VCO 230 output by a fractional value, rather than by an integer value. For the sake of simplicity and brevity, only the operation of feedback divider 330 will be discussed hereafter. However, it will be understood that the following description of feedback divider 330 also applies to output divider 325.

Figure 4:
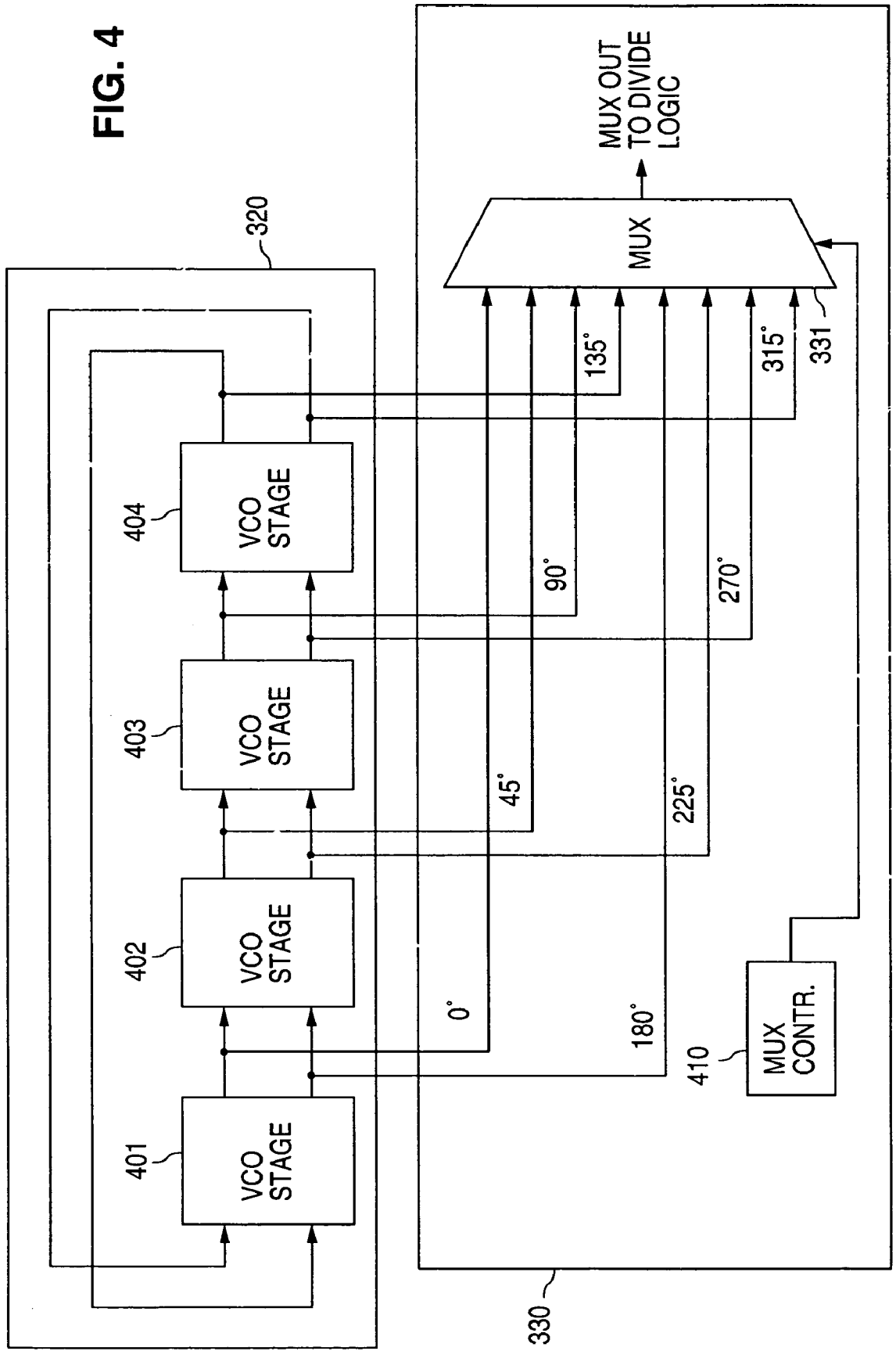
FIG. 4 illustrates selected portions of the voltage-controlled oscillator (VCO) and the feedback divider in FIG. 3 according to one embodiment of the present invention.

FIG. 4 illustrates selected portions of voltage-controller oscillator (VCO) 320 and feedback divider 330 according to one embodiment of the present invention. VCO 320 comprises S voltage-controlled oscillator (VCO) stages. In the exemplary embodiment, VCO 320 contains S=4 stages, namely VCO stage 401, VCO stage 402, VCO stage 403 and VCO stage 404. VCO 320 is a conventional ring oscillator, but the dual outputs of each VCO stage are brought out and fed to an input of multiplexer (MUX) 331 of feedback divider 330. MUX controller 410 controls the operation of MUX 331.

The ring oscillator, the interconnects, and MUX 331 are carefully matched so that the phases of the selected phases at MUX 331 output are equally distributed in time within the cycle of VCO 320. In the four-stage embodiment shown in FIG. 4, each stage accounts for one-eighth of the cycle time of the VCO output. In other words, the outputs of each stage are shifted 45° with respect to each other. Also, each VCO stage has two outputs that are 180° out-of-phase with respect to each other. Thus, at steady state, the outputs of VCO stage 401 are the 0° phase output and the 180° phase output, the outputs of VCO stage 402 are the 45° phase output and the 225° phase output, the outputs of VCO stage 403 are the 90° phase output and the 270° phase output, and the outputs of VCO stage 404 are the 135° phase output and the 315° phase output, respectively.

Under the control of MUX controller 410, MUX 331 can rapidly switch from one multiphase output to another multiphase output to thereby achieve a fraction divisor at the output of divide logic 332 in feedback divider 330.

According to an exemplary embodiment of the present invention, divide logic 332 comprises an integral divider and a fractional divider. The integral divider is conventionally designed. It has a counter which counts the desired number of whole cycles of the selected clock, resets itself, and repeats. The counter is typically triggered on each low-to-high transition (i.e., rising edge) of the output of MUX 331. This desired number of cycles is the integral part of the divider value. For each count sequence, an output pulse is generated.

Also during each count sequence, MUX controller 410 retards or retains the selected clock. MUX controller 410 controls MUX 331 to select a new phase output that may be more retarded than the previous one. This phase difference forms the fractional part of the divide value. To simplify divide logic 332, and to reliably switch between phases without causing clock glitches, the new phase is not selected directly. Instead, on subsequent cycles of the selected clock, the next later phase is selected until the desired phase is reached. It may take as many cycles as there are phases to complete this selection. This imposes a restriction that the integral divider be greater than the number of phases less one. MUX 331 must be carefully designed, since selecting retarded phases may tend to cause glitches.

Figure 5:
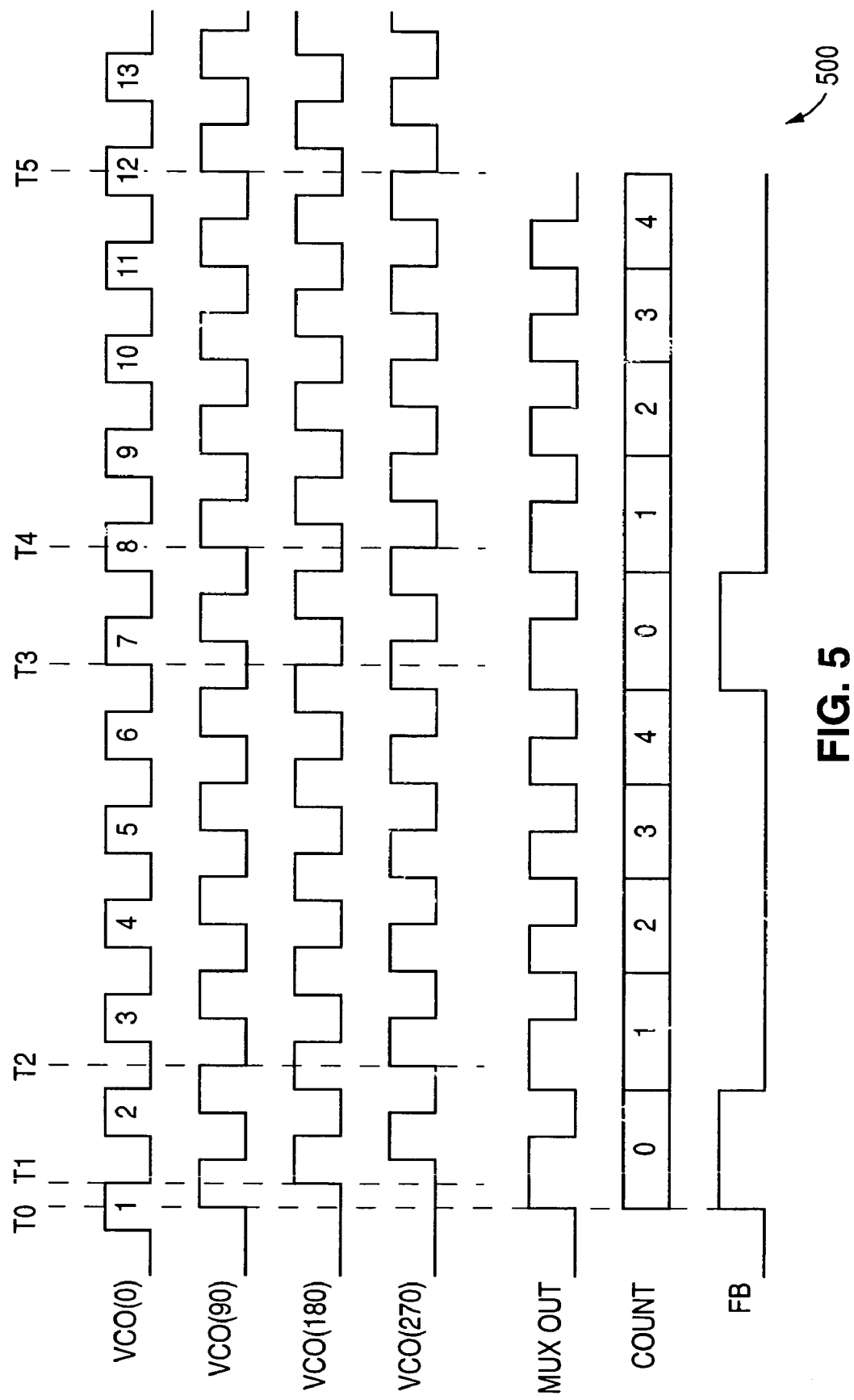
FIG. 5 is a timing diagram illustrating the operation of the feedback divider in FIG. 3 according to one embodiment of the present invention.

FIG. 5 depicts timing diagram 500, which illustrates the operation of feedback divider 330 according to one embodiment of the present invention. For the sake of simplicity, it is assumed that VCO 320 is a two-stage VCO producing four outputs that are 90° apart. The outputs are respectively labeled VCO(0), VCO(90), VCO(180), and VCO(270). Timing diagram 500 shows the output of VCO 320 being divided by 5 and ⅔ (i.e., 5.5).

From time T0 to time T1 (i.e., 0.25 cycles of VCO 320 output), MUX controller 410 switches MUX 331 such that the VCO(90) output is selected by MUX 331 and applied to divide logic 332. From time T1 to time T2 (i.e., 1.25 cycles of VCO 320 output), MUX controller 410 switches MUX 331 such that the VCO(180) output is selected by MUX 331 and applied to divide logic 332. From time T2 to time T3 (i.e., 4.25 cycles of VCO 320 output), MUX controller 410 switches MUX 331 such that the VCO(270) output is selected by MUX 331 and applied to divide logic 332. From time T3 to time T4 (i.e., 1.25 cycles of VCO 320 output), MUX controller 410 switches MUX 331 such that the VCO(0) output is selected by MUX 331 and applied to divide logic 332. Finally, from time T4 to time T5 (i.e., 4.00 cycles of VCO 320 output), MUX controller 410 switches MUX 331 such that the VCO(90) output is selected by MUX 331 and applied to divide logic 332.

The output of MUX 320 is the MUX OUT signal waveform in timing diagram 500. The value of the counter in divide logic 332 is shown as the value COUNT in timing diagram 500. The output of feedback divider 330 is shown as the signal waveform FB in timing diagram 500. As FIG. 5 illustrates, the value COUNT is incremented on each rising edge of the MUX OUT signal. The value of COUNT is reset to 0 every 5 rising edges. Thus, the divide logic 332 divides by an integer value of 5. However, because of the operation of the present invention, the rising edges of MUX OUT are not spaced evenly apart. During the periods when COUNT equals 2, 3, or 4, the MUX OUT signal has the same spacing between rising edges as the VCO output phases. However, during the period when COUNT equals 0 or 1, an extra quarter cycle is added between rising edges of the MUX OUT signal. Thus, the MUX OUT signal is 1.25 cycles of the VCO 320 output when COUNT IS 0 and when COUNT is 1. Overall, the duration between the rising edge of the first COUNT=0 period and the rising edge of the second COUNT=0 period is equal to (1.25+1.25+1.0+1.0+1.0)=5.5 cycles of the VCO 320 output. Thus, feedback divider 330 effectively divides the output of VCO 320 by 5.5.

Those skilled in the art will recognize that PLL frequency synthesizer 130 may be adapted to divide by other fractional amounts. Modifying the number of stages in VCO 320 and altering the pattern of input lines selected by MUX 331 enables PLL frequency synthesizer to divide by other fractional amounts. For example, if VCO 320 comprises eight VCO stages, feedback divider 330 may divide by fractional amounts as small as ⅟₁₆ of a cycle of the output of VCO 320.

In an alternate embodiment, the selected phase may be advanced instead of retarded, which has different disadvantages. When advancing the phase, the period of the selected clock is shortened, which places tighter timing requirements on divide logic 332. The number of whole clock cycles and phase decrements do not correspond to the integral and fractional parts of the divide value, rather the resultant divide value is the number of whole cycles counted minus the number of fractional phase decrements. However, advancing the phase simplifies the design of MUX 331.

Although the present invention has been described with an exemplary embodiment, various changes and modifications may be suggested to one skilled in the art. It is intended that the present invention encompass such changes and modifications as fall within the scope of the appended claims.

What is claimed is:

1. A processing system comprising:
a reference clock generator configured to generate an F(in) reference signal having an F(in) frequency;
a phase-locked loop (PLL) frequency synthesizer configured to be tuned in small step sizes comprising:
a PLL circuit comprising; i) a PLL core configured to receive said F(in) reference signal and generate a plurality of multiphase output signals having an F2 frequency, where F2=F(in) (P+Δp), and ii) a feedback frequency divider configured to receive said plurality of multiphase output signals and generate a feedback signal having a frequency $F2/(P+\Delta p)$ wherein P is an integer and $\Delta p$ is a fractional value less than 1, and wherein said feedback frequency divider comprises a first counter circuit and a first switching circuit configured to receive said plurality of multiphase output signals and selectively apply selected ones of said plurality of multiphase output signals to an input of said first counter circuit;

an output divider configured to receive said plurality of multiphase output signals and generate an output signal, wherein said output divider comprises a second counter circuit and a second switching circuit configured to receive said plurality of multiphase output signals and selectively apply selected ones of said plurality of multiphase output signals to an input of said second counter circuit; and a clock controller configured to control said reference clock generator and to monitor one of said multiphase output signals, wherein said clock controller is configured to tune said F2 frequency by modifying P and $\Delta p$.

2. The processing system as set forth in claim 1 wherein said PLL core comprises a phase detector, a charge pump, a loop filter, and a voltage-controlled oscillator (VCO).

3. The processing system as set forth in claim 2 wherein said phase detector receives and compares said F(in) signal and said feedback signal.

4. The processing system as set forth in claim 3 wherein said VCO generates said plurality of multiphase output signals.

5. The processing system as set forth in claim 1 wherein said first switching circuit comprises a multiplexer and a multiplexer control circuit.

6. A processing system comprising:

a reference clock generator capable of generating an F(in) reference signal having an F(in) frequency;

a phase-locked loop (PLL) frequency synthesizer capable of being tuned in small step sizes comprising:

a PLL circuit comprising: i) a PLL core configured to receive an F(in) signal and generate a plurality of multiphase output signals having an F2 frequency, and ii) a feedback frequency divider configured to receive said plurality of multiphase output signals and generate a feedback signal, and wherein said feedback frequency divider comprises a first counter circuit and a first switching circuit configured to receive said plurality of multiphase output signals and selectively apply selected ones of said plurality of multiphase output signals to an input of said first counter circuit;

an output divider configured to receive said plurality of multiphase output signals and generate an output signal having a frequency F(out), where $F(out)=F2/(N+\Delta n)$, wherein N is an integer and $\Delta n$ is a fractional value less than 1, wherein said output divider comprises a second counter circuit and a second switching circuit configured to receive said plurality of multiplexer output signals and selectively apply selected ones of said plurality of multiphase output signals to an input of said second counter circuit; and a clock controller configured to control said reference clock generator and monitor said output signal, wherein said clock controller is configured to tune said F2 frequency by modifying N and $\Delta n$.

7. The processing system as set forth in claim 6 wherein said PLL core comprises a phase detector, a charge pump, a loop filter, and a voltage-controlled oscillator (VCO).

8. The processing system as set forth in claim 7 wherein said VCO generates said plurality of multiphase output signals.

9. The processing system as set forth in claim 6 wherein said second switching circuit comprises a multiplexer and a multiplexer control circuit.

* * * * *